United States Patent [19]

Ward et al.

[11] Patent Number: 5,139,607
[45] Date of Patent: Aug. 18, 1992

[54] ALKALINE STRIPPING COMPOSITIONS

[75] Inventors: Irl E. Ward, Hatfield; Francis W. Michelotti, Easton, both of Pa.

[73] Assignee: ACT, Inc., Allentown, Pa.

[21] Appl. No.: 690,110

[22] Filed: Apr. 23, 1991

[51] Int. Cl.$^5$ .......................... B44C 1/22; B29C 37/00
[52] U.S. Cl. .................................... 156/655; 156/668; 252/79.5; 430/329
[58] Field of Search ............... 252/79.5, 156; 156/655, 156/659.1, 668; 430/329; 134/22.17, 29, 38, 40

[56] References Cited

U.S. PATENT DOCUMENTS 4,078,102  3/1978  Bendz et al. ................... 252/79.5 X
4,686,002  8/1987  Tasset .............................. 156/659.1

Primary Examiner—William A. Powell
Attorney, Agent, or Firm—John Lezdey

[57] ABSTRACT

An alkaline positive and negative resist stripping composition having low volatility and operable at temperatures less than about 90° C. which comprises, A. about 10 to 30% by weight of tetrahydrofurfuryl alcohol;
B. about 5 to 30% by weight of a polyhydric alcohol;
C. about 10 to 30% by weight of the reaction product of one mole of furfuryl alcohol with about 1 to 20 moles of an alkylene oxide,
D. about 1 to 30% by weight of a water soluble Bronstead base type of hydroxide compound, and
E. the remainder being water.

The composition comprising a ratio of organic materials to inorganic materials to about 0.25:1 to 3:1.

11 Claims, No Drawings

Page number: 5,139,607

ALKALINE STRIPPING COMPOSITIONS

FIELD OF THE INVENTION

The present invention relates to novel stripping compositions for positive and negative photoresists having non-corrosion sensitive substrates. More particularly, the invention is concerned with alkaline stripping compositions having low volatility, low odor and are biodegradable which are particularly useful with photoresists having a ceramic substrate.

BACKGROUND OF THE INVENTION

During manufacture of semiconductors and semiconductor microcircuits, it is frequently necessary to coat the materials from which the semiconductors and microcircuits are manufactured with a polymeric organic substance, generally referred to as a photoresist, e.g., a substance which forms an etch resist upon exposure to light. These photoresists are used to protect selected areas of the surface of the substrate, e.g. silicon, $SiO_2$ or while such etchant selectively attacks the unprotected area of the substrate. Following completion of the etching operation and washing away of the residual etchant, it is necessary that the resist be removed from the protective surface to permit essential finishing operations.

It is necessary in a photolithographic process that the photoresist material, following pattern delineation, be evenly and completely removed from all unexposed areas, in the case of positive resists, or exposed areas in the case of negative resists, so as to permit further lithographic operations. Even the partial remains of a resist in an area to be further patterned is undesirable. Also, undesired resist residues between patterned lines can have deleterious effects on subsequent processes, such as metallization, or cause undesirable surface states and charges.

A common method used in removing the photoresist from the substrate is by contacting the substrate with an organic stripper. Heretofore these organic strippers have been composed of various components whose purpose it was to lift and remove the polymeric photoresist from the substrate. However, these stripping solutions have heretofore usually contained chlorinated hydrocarbon compounds and phenolic compounds which resulted in a distinct disadvantage due to the toxicity of these materials as well as the pollution problems arising from their disposal.

Because many of the toxic components of such stripping compositions are highly volatile and subject to unduly high evaporation rates, the stripping compositions require special human and environmental safety precautions to be taken during storage and use of said compositions.

Recently, OSHA, EPA and other similar Federal, State and Local Governmental Regulatory Agencies have advocated a shift toward use of more human and environmentally compatible stripping compositions and stripping methods that are not subject to the aforementioned drawbacks and problems.

It is also highly desirable that stripping compositions be provided that exhibit very low vapor pressure at elevated temperatures thereby significantly reducing evaporation and thus contamination of the atmosphere.

Additionally, it is highly desirable that such stripping compositions be provided that are effective and efficient stripping compositions for removal of coatings from substrates that heretofore have resisted ready removal with conventional available strippers.

It is also desirable that effective stripping compositions be provided that are not considered undesirable by regulatory agencies overseeing their production and use.

It is also most advantageous that stripping compositions be provided with the above-identified desirable characteristics which evidence synergistic stripping efficacy and stripping results not always obtainable with the additional components.

U.S. Pat. No. 3,615,827 discloses an alkaline stripping composition containing a polyalkylene glycol, ethylene glycol monophenyl ether and a phenol derivative.

U.S. Pat. No. 3,847,839 discloses an alkaline stripping composition which includes an alkoxylated furfuryl alcohol, namely, ethoxylated furfuryl alcohol and a glycol activating agent.

SUMMARY OF THE INVENTION

The present invention provides a novel alkaline stripping composition for both positive and negative photoresists. More particularly, the stripping composition comprises:

1. about 5 to 30% by weight of tetrahydrofurfuryl alcohol preferably about 15 to 20%;
2. about 5 to 30% by weight of a polyhydric alcohol, preferably about 10 to 20%;
3. about 10 to 30% by weight of the reaction product of one mole of furfuryl alcohol with about 1 to 5 moles of an alkylene oxide, preferably about 15 to 25% of the furfuryl alcohol alkylene oxide by weight.
4. about 5 to 30% by weight of a water soluble Bronstead base type hydroxide compound, preferably about 10 to 20% by weight, and
5. the remainder being water, The composition comprises a ratio of organic materials to inorganic materials of about 0.25:1 to 3:1.

Advantageously, about 0.1 to 1.0% by weight of a nonionic surfactant is added to the stripping composition.

Also, it is preferable that the furfuryl alcohol alkylene oxide is present in an excess of the tetrahydrofurfuryl alcohol.

The amount of the condensate of furfuryl alcohol can be present in a ratio up to 3:1 of tetrahydrofurfuryl alcohol.

DESCRIPTION OF THE PREFERRED EMBODIMENTS

In accordance with the present invention, the alkaline stripping composition comprises about 5 to 30% by weight of tetrahydrofurfuryl alcohol, preferably about 10 to 20% by weight.

The stripping composition also contains about to 30% by weight of a polyhydric alcohol, for example, polyalkylene glycols including propylene glycol, dipropylene glycol, polypropylene glycol, polyethylene glycol, ethylene glycol, 1, 3-butylene glycol, pinacol, and the like, as a transfer agent to maintain the base in solution.

The composition contains about 10 to 30% by weight of a reaction product of one mole of furfuryl alcohol which is reacted with about 1 to 5 moles of an alkylene oxide, preferably ethylene oxide or propylene oxide, preferably about 15 to 25% by weight of the furfuryl alcohol alkylene oxide.

The composition also contains about 5 to 30% by weight of a water soluble Bronstead base type of hydroxide compounds, preferably about 10 to 20% by weight. The hydroxide compounds include alkali metal hydroxides, ammonium hydroxide, tetramethylammonium hydroxide, and compounds which form Bronstead base type hydroxides, for example, sodium silicate.

The remainder of the composition is water. Sufficient water is added so as to dissolve the base compound. The polyhydric alcohol is added in an amount to maintain the base compound in the solution after the addition of the organic materials. The final product should contain an amount of the organic materials relative to inorganic materials preferably in a ratio from about 0.5:1 up to about 1:1.

A most preferred stripping composition of the invention comprises:

A. about 15 to 20% by weight of tetrahydrofurfuryl alcohol;

B. about 15 to 25% by weight of ethylene glycol;

C. about 5 to 20% by weight of furfurylalcohol ethylene oxide addition product;

D. about 1 to 20% by weight of an alkali metal hydroxide, and

E. the remainder water.

Optionally, there is included about 0.1 to 1.0% by weight of a nonionic surfactant.

Advantageously the amount of organic materials present is near to or greater than the inorganic materials.

The stripping compositions of this invention may also contain, if desired, any suitable water miscible nonionic detergent which does not adversely affect the stripping action of the compositions of this invention, generally in an amount of about 0.1 to about 2% by weight of the total composition.

The nonionic detergents which may be utilized can be of the three basic types—the alkylene oxide condensates, the amides and the semi-polar nonionics. Preferably, the nonionic detergent is an ethoxylated alkylphenol or alkylphenoxypoly (ethyleneoxy) ethanol, an ethoxylated aliphatic alcohol; polyoxyethylene, a carboxylic ester like a glycerol ester (mono- or di-), and other equivalent nonionic surfactants. Typical suitable ethoxylated alkylphenols are alkylphenols of $C_8$ to $C_{12}$ alkylphenols. It is most preferred that they be water soluble, those having at least 60 weight percent of polyoxyethylene groups being particularly well suited. Such ethoxylated alkylphenols are well known under various trademarks such as Igepal of GAF Corporation, Levelene, Neutronyx, Solar NP, the Surfonic series, and the Triton N and X series marketed by Rohm and Haas Co., just to name a few.

Among the polyoxyethylenes suitable for use in accordance with the invention are the mono- and dialkyl ethers of ethylene glycols and their derivatives. Typical of other nonionics are the monobutyl ether, ethylene glycol monobutyl ether acetate, ethylene glycol monoethyl ether acetate, ethylene glycol dibutyl ether, ethylene glycol monohexyl ether, ethylene glycol monomethyl ether, ethylene glycol monomethyl ether acetate, ethylene glycol monophenyl ether and other equivalent ethers of ethylene glycol. Another group of nonionics are the polyethylene glycols and the alkoxy derivatives, particularly lower alkoxy, such as methoxy polyethylene glycol; also diethylene glycols, propylene glycol and other similar glycols.

Preferred nonionics, by example, are Igepal DM 710 and CO-610 (GAF Corp.); Pluradot HA430, Plurafac RA-30 and -43, Pluronic L-62 and L-10 (BASF Wyandotte Co.): Poly-Tergent LF-405 and SLF-18 and SLF-45 (Olin Co.); Sandoxylate SX series (Sandoz Co.); Emulphogene BC series (GAF Corp).

Other suitable nonionic surfactants for use in the invention are disclosed in Kirk & Othmer, *Encyclopedia of Chemical Technology*, Vol. 19, pages 531 to 554, entitled "Nonionic Surfactants", which is incorporated herein by reference.

The polymeric organic substances which are to be removed by the stripping solutions of the invention are photoresists which generally comprise polymers selected from relatively low molecular weight polyisoprenes, polyvinyl cinnamates and phenol formaldehyde resins. In the case of negative resists, the photoresists are applied to a corrosion resistive substrate, (such as ceramic). The masked substrate is then exposed to light, e.g., a 120 volt 650 watt quartz lamp for 1-5 seconds at a distance of 6-12 inches to harden the exposed photoresist. The portion of the photoresist which is not exposed is removed by solvent development, thus leaving a pattern, e.g., a portion of an electrical circuit pattern, on the exposed substrate. The remaining photoresist is then baked for further hardening and the portion of the substrate which is not covered by the photoresist is etched or otherwise treated. The etchant may be a buffered oxide, acid or plasma etchant which may further processed or used. In employing the stripping solutions of the invention for either positive or negative resists, temperatures from about 20° C. to about 90° C., preferably between 25° and 70° C. are employed. The period required for stripping the photoresist varies to quite an extent, depending on the specific polymer used in the photoresist and photoresist processing conditions. Generally, the time involved will be between 1 and 20 minutes, although some resists, depending upon the bake temperature, may require 25 minutes, 40 minutes or longer before the polymeric photoresist is loosened from the substrate. It should be appreciated that many photoresists are completely dissolved while others may be loosened from the substrate, floated off, and then dissolved in the stripping composition.

After the photoresist has been stripped from the substrate, the substrate is rinsed in any aqueous rinsing liquid. A solvent rinse may follow the stripping step, with solvents such as isopropanol, butylcellosolve or methylcellosolve being used. Since, however, the present compositions are substantially and cleanly water rinsable, it is acceptable to rinse with deionized water of the purity commonly found in semiconductor processing directly after stripping.

The stripping compositions of this invention are especially useful and advantageous for numerous reasons among which may be mentioned the following. The stripping compositions are water soluble, high strip efficacy, non-flammable and of low toxicity to humans and the environment. Because of the low ambient vapor pressure of the compositions they evidence substantially less evaporation than prior compositions and are non-reactive and environmentally compatible. The stripping compositions may be partially recycled or easily disposed of in an environmentally safe manner without the necessity for burdensome safety precautions. After neutralization, the stripping compositions are fully biodegradable. The stripping compositions of this invention evidence higher stripping efficiency at lower temperatures for a wide variety of coatings and substrates. Moreover, the stripping compositions are easily prepared by simply mixing the components at room temperature and thus require no special human or environmental safety precautions. Furthermore, the components of the stripping compositions of this invention provide synergistic stripping action and permit readily and substantially complete removal of coatings from substrates.

The compositions of the invention are particularly useful to remove dielectric components, i.e. silanes and siloxanes which may be found in some resists.

The effectiveness and unexpected nature of the stripping compositions of this invention is illustrated, but not limited by the data presented in the following example.

EXAMPLE 1

A photoresist stripping composition was prepared by mixing the following components.

| Component | % Wt |
|---|---|
| Tetrahydrofurfuryl alcohol | 18.6 |
| Ethylene glycol | 15.0 |
| Furfuryl alcohol ethylene oxide addition product | 22.0 |
| Potassium hydroxide | 12.2 |
| Water | 32.2 |
| | 100.0% |

If desired about 0.1 to 1.0% by weight of a nonionic surfactant may be added. Also, in place of all or part of the furfuryl alcohol ethylene oxide product, there may be used the furfuryl oxide propylene oxide reaction product.

The composition is especially useful for removing the organic materials from photoresists having a ceramic substrate.

EXAMPLES 2-6

The following compositions were prepared and compared with respect to selectivity of attack on the substrate versus efficacy in removal of resist.

| | Examples | | | | |
|---|---|---|---|---|---|
| | 2 | 3 | 4 | 5 | 6 |
| Ingredients | | | WT % | | |
| Tetrahydrofurfuryl Alcohol | 8 | 30 | 30 | 8 | 8 |
| Ethylene glycol | 10 | 25 | 20 | 10 | 16 |
| Furfuryl alcohol Ethylene oxide addition Product | 12 | | | 12 | 10 |
| Potassium hydroxide | | 5 | 3 | | |
| Potassium thiocyanate | | | | | 16 |
| Lithium Hydroxide | | | | 25 | |
| Triethanolamine | 6 | | | | |
| Tetramethylammonium Hydroxide | 24 | | | | |
| Water | 40 | 35 | 46 | 45 | 76 |
| Cab-O-Sil | | | | 1. | |
| Results: | | | | | |
| Selectivity* (Substrate) inertness | 0 | 7 | 4 | — | 2 |
| Resist Removal Performance* | 10 | 7 | 8 | — | 2 |
| Comments: | | | | | |
| (1) *0 = Poor | | | | LioH | No |
| 10 = Best | | | | didn't | Removal |
| (2) Substrate: SiO$_2$ | | | | dissolve | of Resist |
| Si | | | | | |
| epi-Si | | | | | |

What is claimed is:

1. An alkaline positive and negative resist stripping composition having low volatility and operable at temperatures less than about 90° C. for use with resists having non-corrosive sensitive substrates which comprises,
   A. about 5 to 30% by weight of tetrahydrofurfuryl alcohol;
   B. about 5 to 30% by weight of a polyhydric alcohol;
   C. about 10 to 30% by weight of the reaction product of one mole of furfuryl alcohol with about 1 to 20 moles of an alkylene oxide, said furfuryl alcohol reaction product being present in an amount greater than tetrahydrofurfuryl alcohol,
   D. about 1 to 30% by weight of a water soluble Bronstead base type of hydroxide compound, and
   E. the remainder being water, said composition comprising a ratio of organic materials to inorganic materials of about 0.25:1 to 3:1.

2. The composition of claim 1 including about 0.1 to 1.0% by weight of a nonionic surfactant.

3. The composition of claim 1 wherein said polyhydric alcohol is selected from the group consisting of ethylene glycol and propylene glycol.

4. The composition of claim 1 wherein said alkylene oxide of part C is selected from the group consisting of ethylene oxide and propylene oxide.

5. An alkaline positive and negative photoresist stripping composition for use with resists having non-corrosive sensitive substrates which comprises:
   A. about 15 to 20% by weight of tetrahydrofurfuryl alcohol,
   B. about 10 to 20% by weight of ethylene glycol,
   C. about 15 to 25% by weight of the reaction product or furfuryl alcohol and ethylene oxide,
   D. about to 20% by weight of an alkali metal hydroxide, and
   E. the remainder being water.

6. The composition of claim 6 wherein said alkali metal hydroxide is potassium hydroxide.

7. The composition of claim 6 including about 0.1 to 1% by weight of a nonionic surfactant.

8. A process for removing a coating from a coated non-corrosive sensitive substrate comprising applying to said coated substrate an effective amount of a stripping composition of claim 1, permitting said stripping composition to reside on said coated substrate for an effective period of time.

9. A process for removing a coating from a coated non-corrosive sensitive substrate comprising applying to said coated substrate a stripping effective amount of a stripping composition of claim 2, permitting said stripping composition to reside on said coated substrate for a stripping effective period of time and removing the coating from the substrate.

10. A process for removing a coating from a coated non-corrosive sensitive substrate comprising applying to said coated substrate an effective amount of a stripping composition of claim 6, permitting said stripping composition to reside on said coated substrate for a stripping effective period of time and removing the coating from the substrate.

11. A process for removing a coating from a coated non-corrosive sensitive substrate comprising applying to said coated substrate an effective amount of a stripping composition of claim 7, permitting said stripping composition to reside on said coated substrate for a stripping effective period of time and removing the coating from the substrate.

* * * * *